(12) United States Patent
Gao et al.

(10) Patent No.: US 12,356,098 B2
(45) Date of Patent: Jul. 8, 2025

(54) PIXEL DESIGNS WITH REDUCED LOFIC RESET AND SETTLING TIMES

(71) Applicant: OMNIVISION TECHNOLOGIES, INC., Santa Clara, CA (US)

(72) Inventors: Zhe Gao, San Jose, CA (US); Chengcheng Xu, Santa Clara, CA (US); Dennis Tunglin Lee, San Jose, CA (US); Tiejun Dai, Santa Clara, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 284 days.

(21) Appl. No.: 17/849,403

(22) Filed: Jun. 24, 2022

(65) Prior Publication Data

US 2023/0421922 A1 Dec. 28, 2023

(51) Int. Cl.
*H04N 25/75* (2023.01)
*H04N 25/59* (2023.01)
*H10F 39/00* (2025.01)
*H10F 39/18* (2025.01)

(52) U.S. Cl.
CPC .............. *H04N 25/75* (2023.01); *H04N 25/59* (2023.01); *H10F 39/18* (2025.01); *H10F 39/8037* (2025.01)

(58) Field of Classification Search
CPC ...... H04N 25/75; H04N 25/59; H04N 25/621; H04N 25/771; H04N 25/766; H04N 25/77; H01L 27/14612; H01L 27/14643; H01L 27/14609
See application file for complete search history.

(56) References Cited

U.S. PATENT DOCUMENTS

| | | | |
|---|---|---|---|
| 4,323,986 | A | 4/1982 | Malaviva |
| 10,134,788 | B2 | 11/2018 | Lyu et al. |
| 10,154,222 | B2 | 12/2018 | Sugawa et al. |
| 11,140,352 | B1 | 10/2021 | Dai et al. |
| 11,212,457 | B2 | 12/2021 | Dai et al. |
| 11,348,956 | B2 | 5/2022 | Choi et al. |

(Continued)

OTHER PUBLICATIONS

Innocent, M., "Modeling, Characterization and Simulation of Dielectric Absorption in Capacitors in Image Sensors", 2021 International Image Sensor Workshop, publication date Sep. 13, 2021 (4 pages).

(Continued)

*Primary Examiner* — Mekonnen D Dagnew
(74) *Attorney, Agent, or Firm* — Perkins Coie LLP; Daniel L. Jackstadt (57) ABSTRACT

Pixel designs with reduced LOFIC reset and settling times are disclosed herein. In one embodiment, a pixel cell includes a photosensor configured to photogenerate image charge in response to incident light, a floating diffusion to receive the image charge from the photosensor, a transfer transistor coupled between the floating diffusion and the photosensor to transfer the image charge to the floating diffusion, and a first reset transistor coupled between the floating diffusion and the voltage supply. The pixel cell further includes a capacitor having two ends, and a second reset transistor. A first end of the capacitor is coupled to the floating diffusion. The second reset transistor is coupled between a second end of the capacitor and the voltage supply.

37 Claims, 4 Drawing Sheets

(56) References Cited

U.S. PATENT DOCUMENTS

| | | | |
|---|---|---|---|
| 11,399,150 | B2 | 6/2022 | Gao et al. |
| 12,058,460 | B2 | 8/2024 | Choi |
| 2015/0076330 | A1 | 3/2015 | Lyu et al. |
| 2015/0124132 | A1 | 5/2015 | Mabuchi et al. |
| 2016/0181314 | A1* | 6/2016 | Wan .................. H01L 27/14627 |
| | | | 438/60 |
| 2017/0324919 | A1 | 11/2017 | Lee et al. |
| 2017/0347047 | A1 | 11/2017 | Mao et al. |
| 2018/0234652 | A1* | 8/2018 | Sugawa ................. H04N 25/78 |
| 2021/0136275 | A1 | 5/2021 | Solhusvik |
| 2021/0144319 | A1 | 5/2021 | Innocent et al. |
| 2021/0168312 | A1 | 6/2021 | Madurawe et al. |
| 2021/0183926 | A1 | 6/2021 | Choi et al. |
| 2021/0377435 | A1 | 12/2021 | Dai et al. |
| 2022/0013554 | A1 | 1/2022 | Mun et al. |
| 2023/0164447 | A1 | 5/2023 | Wang et al. |
| 2023/0316963 | A1* | 10/2023 | Bi .......................... G09G 3/006 |
| | | | 345/214 |

OTHER PUBLICATIONS

Sakano, Y. et al., "A 132dB Single-Exposure-Dynamic-Range CMOS Image Sensor with High Temperature Tolerance", 2020 IEEE International Solid-State Circuits Conference, Feb. 17, 2020 (22 pages).

* cited by examiner

PIXEL DESIGNS WITH REDUCED LOFIC RESET AND SETTLING TIMES

TECHNICAL FIELD

This disclosure relates generally to image sensors. For example, several embodiments of the present technology relate to pixel cells having lateral overflow integration capacitors (LOFICs), including pixel cells with LOFIC auto-zeroing capabilities for reduced LOFIC reset and settling times.

BACKGROUND

Image sensors have become ubiquitous and are now widely used in digital cameras, cellular phones, security cameras, as well as medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to provide information that is representative of the external scene.

BRIEF DESCRIPTION OF THE DRAWINGS

Non-limiting and non-exhaustive embodiments of the present technology are described below with reference to the following figures, in which like or similar reference characters are used to refer to like or similar components throughout unless otherwise specified.

Skilled artisans will appreciate that elements in the figures are illustrated for simplicity and clarity and are not necessarily drawn to scale. For example, the dimensions of some of the elements in the figures may be exaggerated relative to other elements to aid in understanding of various aspects of the present technology. In addition, common but well-understood elements or methods that are useful or necessary in a commercially feasible embodiment are often not depicted in the figures or described in detail below to avoid unnecessarily obscuring the description of various aspects of the present technology.

DETAILED DESCRIPTION

The present disclosure relates to pixel cells with LOFICs. For example, several embodiments of the present technology are directed to pixel cells that incorporate LOFICs for high dynamic range and that can selectively auto-zero the LOFICs for reduced LOFIC reset and settling times. In the following description, specific details are set forth to provide a thorough understanding of aspects of the present technology. One skilled in the relevant art will recognize, however, that the systems, devices, and techniques described herein can be practiced without one or more of the specific details set forth herein, or with other methods, components, materials, etc.

Reference throughout this specification to an "example" or an "embodiment" means that a particular feature, structure, or characteristic described in connection with the example or embodiment is included in at least one example or embodiment of the present technology. Thus, use of the phrases "for example," "as an example," or "an embodiment" herein are not necessarily all referring to the same example or embodiment and are not necessarily limited to the specific example or embodiment discussed. Furthermore, features, structures, or characteristics of the present technology described herein may be combined in any suitable manner to provide further examples or embodiments of the present technology.

Spatially relative terms (e.g., "beneath," "below," "over," "under," "above," "upper," "top," "bottom," "left," "right," "center," "middle," and the like) may be used herein for ease of description to describe one element's or feature's relationship relative to one or more other elements or features as illustrated in the figures. It will be understood that the spatially relative terms are intended to encompass different orientations of a device or system in use or operation, in addition to the orientation depicted in the figures. For example, if a device or system illustrated in the figures is rotated, turned, or flipped about a horizontal axis, elements or features described as "below" or "beneath" or "under" one or more other elements or features may then be oriented "above" the one or more other elements or features. Thus, the exemplary terms "below" and "under" are non-limiting and can encompass both an orientation of above and below. The device or system may additionally, or alternatively, be otherwise oriented (e.g., rotated ninety degrees about a vertical axis, or at other orientations) that illustrated in the figures, and the spatially relative descriptors used herein are interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

A. OVERVIEW

Many pixel cells incorporate lateral overflow integration capacitors (LOFICs) to increase the full well capacity of the pixel cells and thereby increase high dynamic range capabilities of corresponding image sensors. LOFIC capacitance is positively correlated with full well capacity. Thus, as the capacitance of a LOFIC employed in a pixel cell increases, the full well capacity of the pixel cell also increases. For this reason, higher LOFIC capacitance is commonly desired.

But as the capacitance of a LOFIC increases, the time required for the LOFIC to charge and/or to reset also increases. Furthermore, LOFICs of pixel cells arranged in a row of a pixel array are typically coupled to a pair of global row drivers (e.g., a global row pull-down driver and a global row pull-up driver) to facilitate charging and/or resetting the LOFICs. Thus, as the capacitances of LOFICs in pixel cells of a row increase, a total capacitance load on the lines connecting the LOFICs to the global row drivers also increases, resulting in (a) longer row LOFIC charge and reset times and (b) a decrease in the likelihood that the global row drivers are able to charge and/or reset the LOFICs in the row within the time allotted by the image sensor. This problem is only exacerbated with demand for larger pixel arrays because an increase in the number of pixel cells per row further increases the total capacitance load on the lines connecting the LOFICs to the global row drivers. If the time allotted by the image sensor to reset and settle the LOFICs is not enough, banding (e.g., image artifacts, horizontal fixed pattern noise, etc.) can be observed in a resulting image. Thus, to continue increasing LOFIC capacitances in the pixels cells described above while avoiding banding, the time allotted for charging and/or resetting the LOFICs of pixels cells in a row must be increased at a tradeoff of slower frame rates.

To address these concerns, pixel cells of the present technology can include reset transistors coupled between the LOFICs and a supply voltage. For example, a pixel cell of the present technology can include (a) a first reset transistor coupling a floating diffusion to a supply voltage, (b) a dual floating diffusion (DFD) transistor coupling a first end of a LOFIC to the floating diffusion, and/or (c) a second reset transistor coupling a second end of the LOFIC to the supply voltage. The second end of the LOFIC can additionally be selectively coupled to a global row pull-down driver to facilitate charging the LOFIC.

The second reset transistor can be activated to locally pull the second end of the LOFIC toward the supply voltage, obviating use of a global row pull-up driver external to the pixel cell. In addition, the first reset transistor, the second reset transistor, and/or the DFD transistor can be activated to locally reset the LOFIC and to short the first and second ends of the LOFIC together (thereby auto-zeroing the LOFIC). Because reset of the LOFIC is performed locally, the reset time of the LOFIC is reduced in comparison to a LOFIC that is globally reset with other LOFICs using a row driver. Furthermore, auto-zeroing the LOFIC reduces the settling time of the LOFIC, enabling faster precharge and/or LOFIC readout operations (and therefore faster frame rates). As a result, the present technology facilitates use of LOFICs with larger capacitances and/or use of a larger number of pixel cells per row without significant risk of violating timing specifications defined by the image sensor and/or without requiring larger precharge and/or LOFIC reset timing margins.

B. SELECTED EMBODIMENTS OF PIXEL DESIGNS WITH REDUCED LOFIC PIXEL RESET AND SETTLING TIMES, AND ASSOCIATED SYSTEMS, DEVICES, AND METHODS

Figure 1:
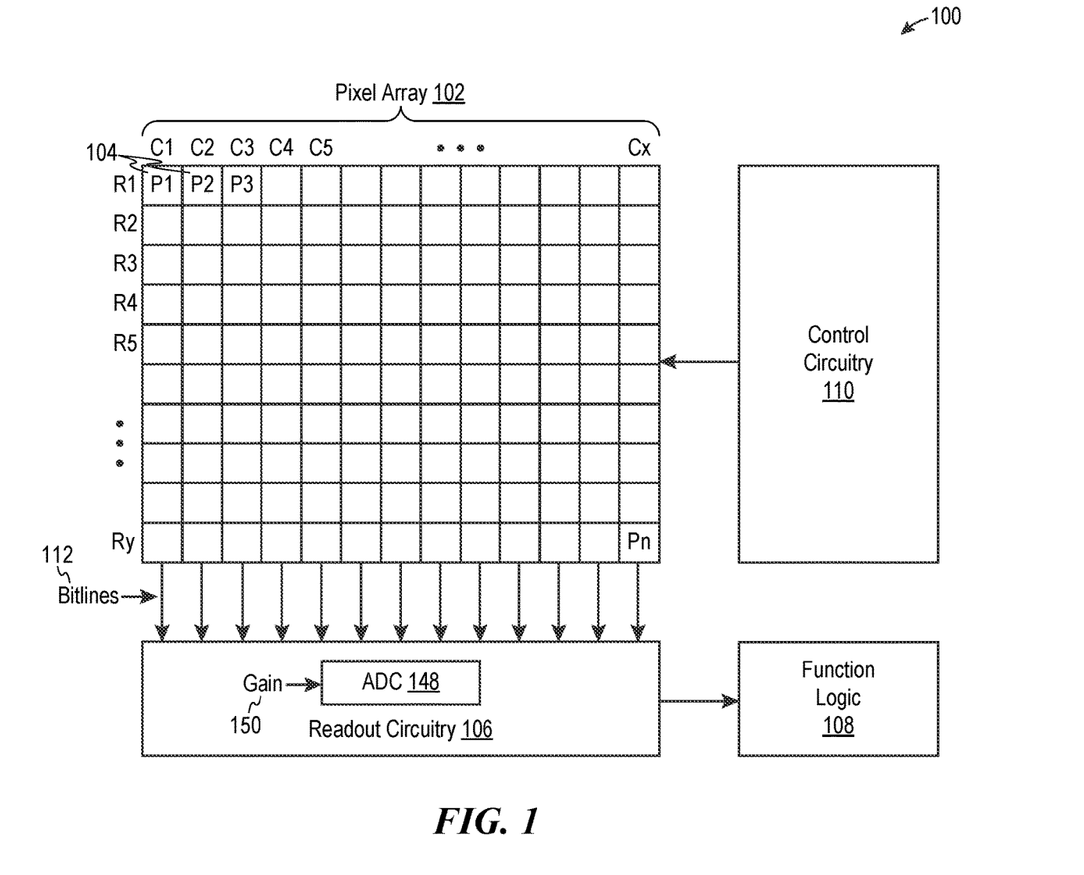
FIG. 1 is a partially schematic block diagram of an imaging system configured in accordance with various embodiments of the present technology.

FIG. 1 is a partially schematic block diagram of an imaging system 100 configured in accordance with various embodiments of the present technology. As shown, the imaging system 100 includes a pixel array 102, readout circuitry 106, function logic 108, and control circuitry 110. The pixel array can be a two-dimensional (2D) array including a plurality of pixel cells 104 (identified individually in FIG. 1 as pixel P1 through pixel Pn) that are arranged in rows (identified individually in FIG. 1 as row R1 through row Ry) and columns (identified individually in FIG. 1 as column C1 to column Cx). The pixel cells 104 are each configured to acquire image charge in response to incident light received from an external scene, and to generate a corresponding analog image charge data signal based at least in part on the acquired image charge.

After each pixel cell 104 has acquired image charge, the corresponding analog image charge data signals are read out of the pixel array 102 along column bitlines 112 and into the readout circuitry 106. In some embodiments, the analog image charge data signals are read out from the pixel array 102 one row of pixel cells 104 at a time. Alternatively, the analog image charge data signals are read out from the pixel array 102 using other suitable techniques, such as (a) using a serial read out technique to read out the pixel cells 104 one-by-one in sequence or (b) using a parallel read out technique to read out all or a subset (e.g., multiple rows) of the pixel cells 104 simultaneously.

When the analog image charge data signals are read into the readout circuitry 106, the analog image charge data signals can be converted into digital values (digital representations) using an analog-to-digital converter (ADC) 148. In some embodiments, the ADC 148 of the readout circuitry 106 has adjustable gain 150 such that the analog image charge data signals can be read out of the pixel array 102 with multiple gain settings. Although not shown in FIG. 1, the readout circuitry 106 can additionally, or alternatively, include amplification circuitry, column readout circuitry, and/or other circuitry.

The digital representations of the analog image charge data signals may then be transferred from the readout circuitry 106 to the function logic 108. In some embodiments, the function logic 108 is configured to simply store the digital representations as image data. In other embodiments, the function logic 108 can be configured to manipulate the image data (e.g., by applying post image effects, such as crop, rotate, red eye removal, brightness adjustment, contrast adjustment, etc.) in addition to storing the image data. The image data can be used to render an image of the external scene (e.g., of a person, place, object, etc. within the external scene) from which the light incident on the pixel cells 104 of the pixel array 102 was received.

As shown, the control circuitry 110 is coupled to the pixel array 102. In some embodiments, the control circuitry 110 controls operational characteristics of the pixel array 102. For example, the control circuitry 110 can generate transfer gate signals and/or other control signals (e.g., reset signals) that are used (a) to control transfer of image charge and/or other signals within each of the pixel cells 104 and/or (b) to control readout of analog image charge data signals from the pixel array 102. As another example, the control circuitry 110 can generate a shutter signal for controlling image acquisition. The shutter signal can be a global shutter signal for enabling all of the pixel cells 104 of the pixel array 102 to simultaneously capture respective image charge (and a corresponding analog image charge data signal) during a single acquisition window. Alternatively, the shutter signal can be a rolling shutter signal such that each row, column, or other grouping of pixel cells 104 is sequentially enabled to capture respective image charge (and corresponding analog image charge data signals) during consecutive acquisition windows. In some embodiments, the shutter signal can establish an exposure time (e.g., defined as a length of time that a shutter remains open, although the imaging system 100 may lack a physical shutter). The exposure time can be the same for each image frame, or the exposure time can vary across different image frames.

Figure 2:
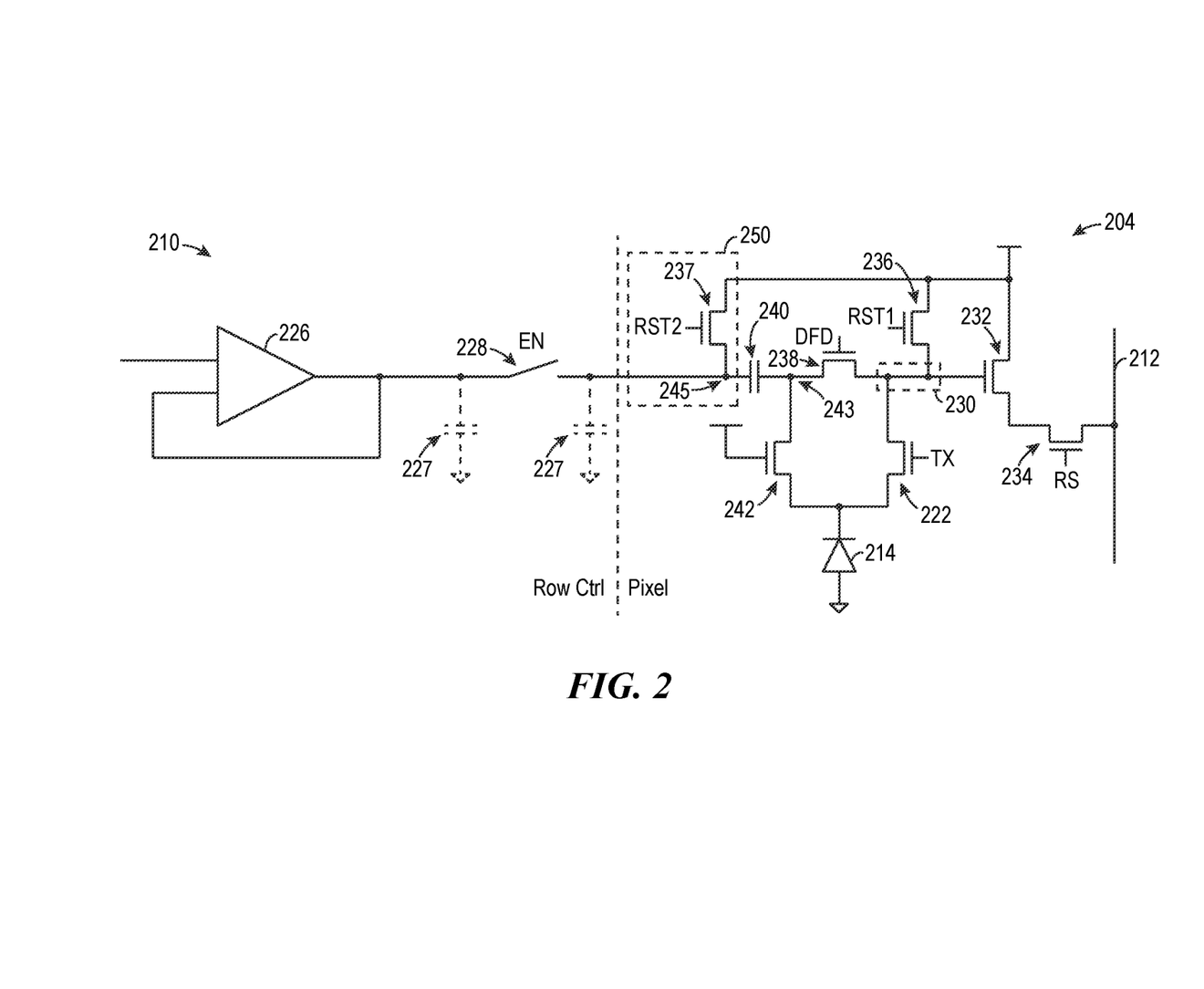
FIG. 2 is a partially schematic diagram of a pixel cell and row control circuitry, each configured in accordance with various embodiments of the present technology.

FIG. 2 is a partially schematic diagram of a pixel cell 204 coupled to row control circuitry 210. The pixel cell 204 can be one of the pixel cells 104 of FIG. 1 or another pixel cell of the present technology. Additionally, or alternatively, the row control circuitry 210 can be part of the control circuitry 110 of FIG. 1 or other control circuitry of the present technology.

As shown in FIG. 2, the pixel cell 204 includes a photosensor 214, a transfer transistor 222, a floating diffusion 230, a source follower transistor 232, a row select transistor 234, a first reset transistor 236, a second reset transistor 237, a dual floating diffusion (DFD) transistor 238, a lateral overflow integration capacitor (LOFIC) 240, and a LOFIC transistor 242. The photosensor 214 is illustrated as a photodiode in FIG. 2 having an anode coupled to ground (e.g., a negative power supply rail or another reference voltage) and a cathode coupled to (a) the transfer transistor 222 and (b) the LOFIC transistor 242. In operation, the photosensor 214 of FIG. 1 is configured to photogenerate image charge in response to incident light received from an external scene. In other embodiments of the present technology, the photosensor 214 may be another suitable type of photosensor or photodetector (e.g., a metal-semiconductor-metal (MSM) photodetector, a phototransistor, a photoconductive detector, or a phototube).

The transfer transistor 222 couples the floating diffusion 230 to the photosensor 214. More specifically, the transfer transistor 222 includes a gate configured to receive a transfer signal TX. Upon assertion of the transfer signal TX, the transfer transistor 222 is configured to transfer image charge generated by the photosensor 214 to the floating diffusion 230. In some embodiments, the transfer transistor 222 can be omitted from the pixel cell 204. The floating diffusion 230 is further coupled to (a) the DFD transistor 238, (b) the first reset transistor 236, and (c) a gate of the source follower transistor 232.

The LOFIC transistor 242 couples the photosensor 214 to a first LOFIC node 243 that is coupled to a first end of the LOFIC 240. More specifically, the LOFIC transistor 242 includes a gate coupled to a reference voltage (e.g., a positive power supply rail (VDD or PIXVDD), or another voltage). Thus, the LOFIC transistor 242 can transfer image charge generated by the photosensor 214 to the first LOFIC node 243.

The DFD transistor 238 couples the first LOFIC node 243 to the floating diffusion 230. More specifically, the DFD transistor 238 includes a gate configured to receive a dual floating diffusion signal DFD. Upon assertion of the dual floating diffusion signal DFD, the DFD transistor 238 is configured to couple (a) the first end of the LOFIC 240 and the first LOFIC node 243 to (b) the floating diffusion 230, the first reset transistor 236, and the gate of the source follower transistor 232. In some embodiments, the DFD transistor 238 can be omitted from the pixel cell 204.

The LOFIC 240 can be a high-density capacitor. For example, the LOFIC 240 can be a three-dimensional (3D) metal-insulator-metal (MIM) capacitor. The insulator can be a dielectric material with a high dielectric constant (κ). In some embodiments, the LOFIC 240 has a large capacitance (e.g., greater than 100 femtofarads (fF), such as around 300 fF or greater). In other embodiments, the LOFIC 240 can have a relatively smaller capacitance (e.g., less than 100 fF). In any embodiment, the LOFIC 240 can be employed in the pixel cell 204 to expand a dynamic range of the pixel cell 204. For example, the LOFIC 240 can be configured to receive overflow charge from the photosensor 214 when the image charge generated from the photosensor 214 exceeds a predetermined amount (e.g., a maximum amount that the floating diffusion 230 can receive or store, or another threshold amount). As shown, the first end of the LOFIC 240 is coupled to the DFD transistor 238 and to the LOFIC transistor 242 via the first LOFIC node 243, and a second end of the LOFIC 240 is coupled to the second reset transistor 237 and to the row control circuitry 210 via a second LOFIC node 245. The line connecting the row control circuitry 210 to the second LOFIC node 245 and the second end of the LOFIC 240 is commonly referred to as a voltage capacitance (VCAP) line.

The first reset transistor 236 is coupled between the floating diffusion 230 and a supply voltage (e.g., a positive power supply voltage (VDD or PIXVDD), or another reference voltage), and the second reset transistor 237 is coupled between the second end of the LOFIC 240 and the supply voltage (e.g., between the second LOFIC node 245 and the supply voltage). A gate of the first reset transistor 236 is configured to receive a first reset signal RST1, and a gate of the second reset transistor 237 is configured to receive a second reset signal RST2. As discussed in greater detail below, the first reset signal RST1 and the second reset signal RST2 can be asserted to reset or settle the pixel cell 204 (e.g., to reset or settle the floating diffusion 230 and/or the LOFIC 240). For example, when the first reset signal RST1 is asserted, the floating diffusion 230 can be pulled up toward the supply voltage (e.g., through the first reset transistor 236). As another example, when the second reset signal RST2 is asserted, the second LOFIC node 245 and the second end of the LOFIC 240 can be pulled up toward the supply voltage (e.g., via the second reset transistor 237). As still another example, when the first reset signal RST1, the second reset signal RST2, and the dual floating diffusion signal DFD are all asserted, an electrical loop (e.g., extending from the first end of the LOFIC 240 to the second end of the LOFIC 240 through the DFD transistor 238, the first reset transistor 236, and the second reset transistor 237) can connect or short the first and second ends of the LOFIC 240 together and quickly settle the LOFIC 240.

In some embodiments, the second reset transistor 237 can be shared amongst more than one pixel cell of a pixel array (as shown by box 250 illustrated in broken lines in FIG. 2). For example, the source of the second reset transistor 237 can be coupled to the second end of the LOFIC 240 of the pixel cell 204 in addition to second end(s) of LOFIC(s) of one or more other pixel cells (not shown). The one or more other pixel cells sharing the second reset transistor 237 with the pixel cell 204 of FIG. 2 can include one or more pixel cells in a same row of the pixel array as the pixel cell 204. Additionally, or alternatively, the one or more other pixel cells sharing the second reset transistor 237 with the pixel cell 204 can include one or more pixels cells in one or more different rows of the pixel array than the row of the pixel array including the pixel cell 204. The one or more other pixel cells sharing the second reset transistor 237 with the pixel cell 204 can have a same or similar reset and/or readout timing as the pixel cell 204. For example, analog image charge data signals of the one or more other pixels cells and of the pixel cell 204 can be reset and/or read out simultaneously.

The source follower transistor 232 of the pixel cell 204 of FIG. 2 is coupled to the voltage supply and to the row select transistor 234. The row select transistor 234 is coupled between the source follower transistor 232 and a column bitline 212. As shown, the row select transistor 234 is configured to receive a row select signal RS. In operation, the source follower transistor 232 is configured to output an analog image charge data signal to the column bitline 212 through the row select transistor 234 upon assertion of the row select signal RS. The analog image charge data signal output onto the column bitline 212 is based at least in part on an amount of image charge in the floating diffusion 230.

Referring now to the row control circuitry 210 of FIG. 2, the row control circuitry 210 includes a row driver 226 and a switch 228. Parasitic capacitance 227 of the row control circuitry 210 is also shown in FIG. 2. In some embodiments, the switch 228 is an enable transistor. In operation, the switch 228 is configured to selectively couple the row driver 226 to the second LOFIC node 245 and the second end of the LOFIC 240 based at least in part on an enable signal EN (e.g., applied to a gate of the enable transistor). For example, when the enable signal EN is asserted, the switch 228 can couple the row driver 226 to the second LOFIC node 245 and to the second end of the LOFIC 240. Continuing with this example, when the enable signal EN is not asserted, the switch 228 can uncouple the row driver 226 from the second LOFIC node 245 and from the second end of the LOFIC 240.

Because the second LOFIC node 245 and the second end of the LOFIC 240 can be pulled up toward the supply voltage via the second reset transistor 237 when the second reset signal RST2 is asserted, the pixel cell 204 can obviate use of a pull-up row driver in the row control circuitry 210. Thus, in some embodiments, imaging systems (e.g., the imaging system 100 of FIG. 1) incorporating the pixel cell 204 of FIG. 2 can omit or lack a pull-up row driver in the row control circuitry 210 coupled to the pixel cell 204. As a result, the row driver 226 of FIG. 2 can be a simple voltage buffer or pull-down row driver in some embodiments. In operation, the row driver 226 can be configured to pull the second LOFIC node 245 and/or the second end of the LOFIC 240 down toward a ground voltage (e.g., a negative power supply voltage or another reference voltage) when the row driver 226 is coupled to the second LOFIC node 245 and/or to the second end of the LOFIC 240 via the switch 228.

Figure 3:
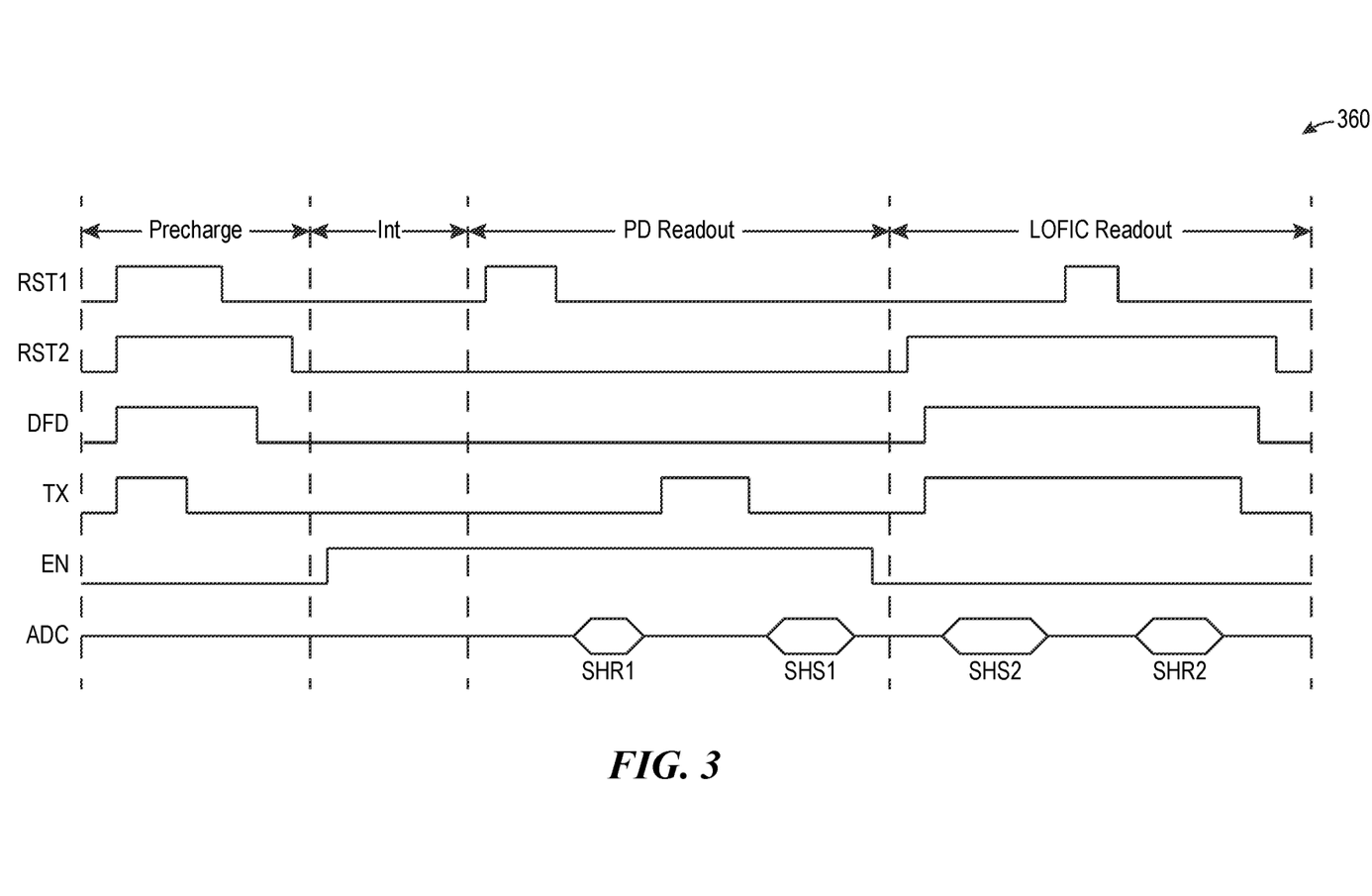
FIG. 3 is a timing diagram illustrating a method of operating a pixel cell in accordance with various embodiments of the present technology.

FIG. 3 is a timing diagram 360 illustrating a method of operating the pixel cell 204 of FIG. 2 in accordance with various embodiments of the present technology. As shown in FIG. 3, the timing diagram 360 is separated into four operations or phases that include a precharge operation, an integration operation, a photodetector (PD) readout operation, and a LOFIC (or capacitor) readout operation.

Referring to FIGS. 2 and 3 together, the precharge operation is performed to reset the pixel cell 204. More specifically, the first reset signal RST1, the second reset signal RST2, the dual floating diffusion signal DFD, and the transfer signal TX are each asserted while the enable signal EN is unasserted. Thus, the pixel cell 204 is uncoupled from the row driver 226 of the row control circuitry 210 while the first reset transistor 236, the second reset transistor 237, the DFD transistor 238, and the transfer transistor 222 are each activated. As a result, the floating diffusion 230 and the LOFIC 240 are locally pulled up toward the supply voltage (e.g., without use of a global row pull-up driver). In addition, an electrical loop (e.g., extending from the first end of the LOFIC 240 to the second end of the LOFIC 240 through the DFD transistor 238, the first reset transistor 236, and the second reset transistor 237) connects or shorts the first and second ends of the LOFIC 240 together. As such, it is expected that charge will be redistributed between the first and second ends of the LOFIC 240 to quickly settle the LOFIC 240 after or as the LOFIC 240 is reset. It is also expected that no charge will leak to the supply voltage or to the row driver 226 during this process, and that the row driver 226 will not be disturbed (e.g., because it is uncoupled from the pixel cell 204 via the switch 228). The transfer signal TX, the first reset signal RST1, the dual floating diffusion signal DFD, and the second reset signal RST2 are then sequentially deasserted toward the end of the precharge operation and before the start of the integration operation.

The integration operation is performed to accumulate image charge in the pixel cell 204. A duration of the integration period corresponds to an exposure time of the pixel cell 204. During the integration operation, the enable signal EN is asserted while each of the other signals are unasserted. As such, the row driver 226 of the row control circuitry 210 is coupled to the second LOFIC node 245 and to the second end of the LOFIC 240 via the switch 228 while the second reset transistor 237, the DFD transistor 238, and the first reset transistor 236 are off. In turn, the row driver 226 pulls the second LOFIC node 245 and the second end of the LOFIC 240 down toward a ground voltage (e.g., a negative power supply rail or another reference voltage). In some embodiments, the row driver 226 sees a relatively small capacitance loading on the VCAP line coupling the row driver 226 to the second end of the LOFIC 240 that is due at least in part to the capacitance of the LOFIC 240 arranged in series with parasitic capacitance (not shown) at the first LOFIC node 243. In the embodiment illustrated in FIG. 3, the enable signal EN is left asserted while the pixel cell 204 moves from the integration operation to the PD readout operation.

During the PD readout operation, the row select signal RS (shown in FIG. 2 but not shown in FIG. 3) is asserted to activate the row select transistor 234, and an analog image charge data signal corresponding to the photosensor 214 is read out from the pixel cell 204 onto the column bitline 212. In some embodiments, the analog image charge data signal corresponding to the photosensor 214 is read out onto the column bitline 212 using correlated double sampling (CDS). For example, the first reset signal RST1 is pulsed while the second reset signal RST2, the dual floating diffusion signal DFD, and the transfer signal TX are unasserted. During the pulse of the first reset signal RST1, the first reset transistor 236 is activated, and the floating diffusion 230 is pulled up toward the supply voltage. After pulsing the first reset signal RST1, a reset value of the PD readout operation that is output from the pixel cell 204 onto the column bitline 212 via the row select transistor 234 is sampled and held by readout circuitry (e.g., the readout circuitry 106 of FIG. 1) peripheral to the pixel cell 204, as indicated by "SHR1" in an analog-to-digital signal ADC illustrated in FIG. 3.

In turn, the transfer signal TX is pulsed while the first reset signal RST1, the second reset signal RST2, and the dual floating diffusion signal DFD are unasserted. During the pulse of the transfer signal TX, the transfer transistor 222 is activated, and image charge generated by the photosensor 214 during the integration operation is transferred to the floating diffusion 230. After the pulse of the transfer signal TX, an analog image charge data signal of the PD readout operation that is output from the pixel cell 204 onto the column bitline 212 via the row select transistor 234 is sampled and held by the readout circuitry peripheral to the pixel cell 204, as indicated by "SHS1" in the analog-to-digital signal ADC illustrated in FIG. 3. The analog image charge data signal of the PD readout operation can be based at least in part on an amount of image charge in the floating diffusion 230. In the embodiment illustrated in FIG. 3, the enable signal EN is then deasserted toward the end of the PD readout operation to uncouple the row driver 226 from the second LOFIC node 245 and the second end of the LOFIC 240.

During the LOFIC readout operation, the row select signal RS (shown in FIG. 2 but not shown in FIG. 3) can remain asserted to activate the row select transistor 234, and an analog image charge data signal corresponding to the LOFIC 240 and the photosensor 214 can be read out onto the column bitline 212. In some embodiments, the analog image charge data signal corresponding to the LOFIC 240 and the photosensor 214 is read out onto the column bitline 212 using CDS. For example, the second reset signal RST2 is asserted to activate the second reset transistor 237 and pull the second LOFIC node 245 and the second end of the LOFIC 240 up toward the supply voltage (e.g., without use of a global row pull-up driver). As shown in FIG. 3, at no time is the second reset signal RST2 asserted while the enable signal EN is asserted. In other words, assertion of the second reset signal RST2 does not overlap with assertion of the enable signal EN such that there is not a time at which the second LOFIC node 245 and the second end of the LOFIC 240 are actively coupled to both (a) the row driver 226 via the switch 228 and (b) the supply voltage via the second reset transistor 237.

After the second reset signal RST2 is asserted, the dual floating diffusion signal DFD and the transfer signal TX are asserted to activate the DFD transistor 238 and the transfer transistor 222, respectively. As such, image charge is transferred to the floating diffusion 230, and an analog image charge data signal corresponding to the LOFIC 240 and the photosensor 214 is output onto the column bitline 212 via the row select transistor 234 that is based at least in part on an amount of image charge in the floating diffusion 230. The analog image charge data signal corresponding to the LOFIC 240 and the photosensor 214 is then sampled and held by the readout circuitry peripheral to the pixel cell 204, as indicated by "SHS2" in the analog-to-digital signal ADC illustrated in FIG. 3.

The first reset signal RST1 is then pulsed to reset the LOFIC 240 and the floating diffusion 230. More specifically, the first reset signal RST1 is pulsed while the second reset signal RST2, the dual floating diffusion signal DFD, and the transfer signal TX are asserted. Thus, during the pulse of the first reset signal RST 1, the LOFIC 240 and the floating diffusion 230 are locally pulled up toward the supply voltage (e.g., without use of a global row pull-up driver). In addition, an electrical loop (e.g., extending from the first end of the LOFIC 240 to the second end of the LOFIC 240 through the DFD transistor 238, the first reset transistor 236, and the second reset transistor 237) connects or shorts the first and second ends of the LOFIC 240 together. As such, it is expected that charge will be redistributed between the first and second ends of the LOFIC 240 to quickly settle the LOFIC 240. It is also expected that no charge will leak to the supply voltage or to the row driver 226 during this process, and that the row driver 226 will not be disturbed (e.g., because it remains uncoupled from the pixel cell 204 via the switch 228 while the enable signal EN is unasserted). After pulsing the first reset signal RST1, a reset value of the LOFIC readout operation that is output from the pixel cell 204 onto the column bitline 212 via the row select transistor 234 is sampled and held by the readout circuitry peripheral to the pixel cell 204, as indicated by "SHR2" in the analog-to-digital signal ADC illustrated in FIG. 3. The transfer signal TX, the first reset signal RST1, the dual floating diffusion signal DFD, and the second reset signal RST2 are then sequentially deasserted at the end of the LOFIC readout operation.

Figure 4:
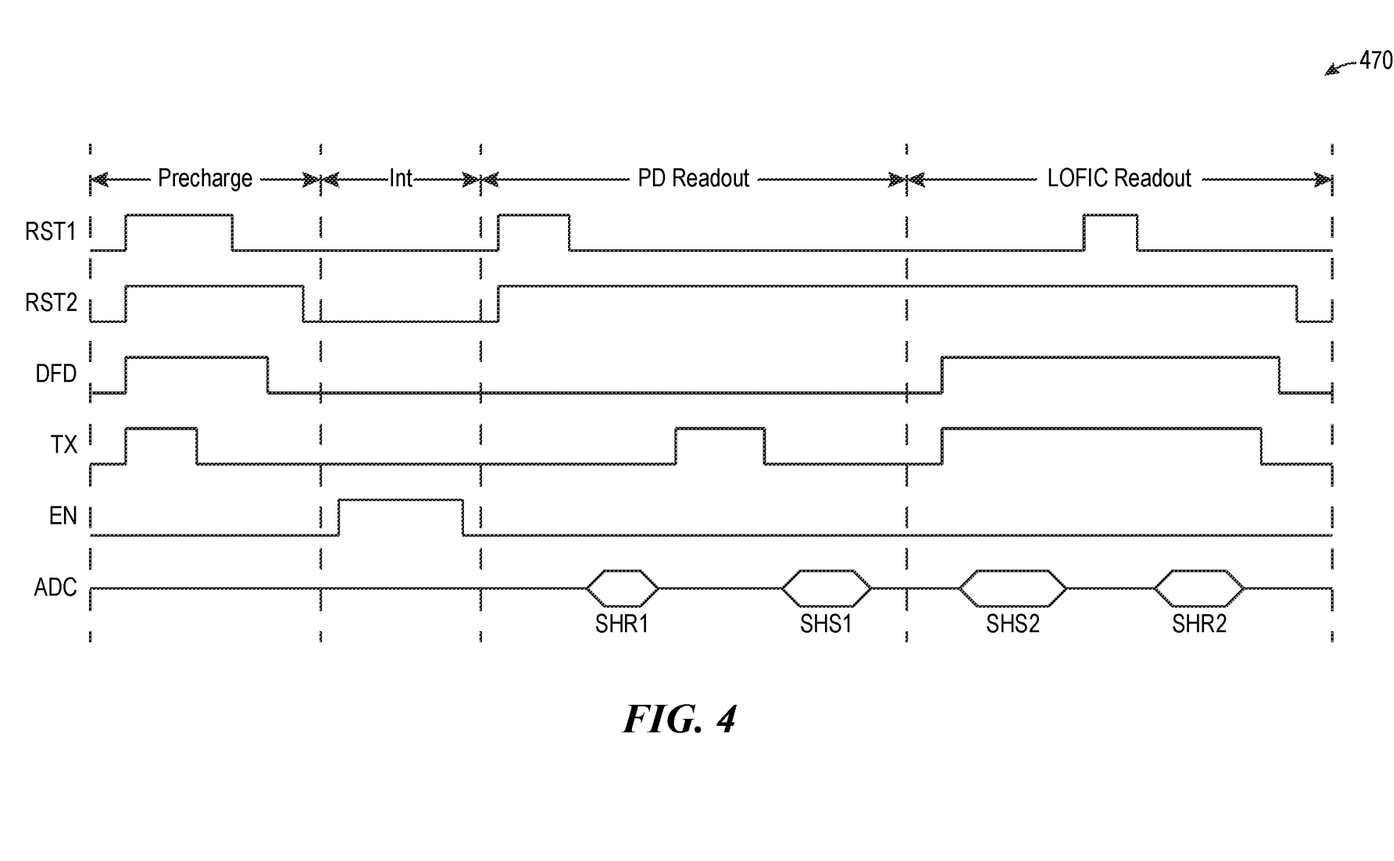
FIG. 4 is a timing diagram illustrating another method of operating a pixel cell in accordance with various embodiments of the present technology.

FIG. 4 is a timing diagram 470 illustrating another method of operating the pixel cell 204 of FIG. 2 in accordance with various embodiments of the present technology. As shown, the timing diagram 470 is similar to the timing diagram 360 of FIG. 3 with the exception of the second reset signal RST2 and the enable signal EN during the integration and PD readout operations. Thus, a detailed discussion of the pre-charge and LOFIC readout operations illustrated in FIG. 4 is omitted below for the sake of brevity.

The integration operation illustrated in the timing diagram 470 of FIG. 4 is largely similar to the integration operation illustrated in the timing diagram 360 of FIG. 3. For example, referring to FIGS. 2 and 4 together, the enable signal EN is asserted toward a beginning of the integration operation while each of the other signals are unasserted. As such, the row driver 226 of the row control circuitry 210 is coupled to the second LOFIC node 245 and to the second end of the LOFIC 240 via the switch 228 while the second reset transistor 237, the DFD transistor 238, and the first reset transistor 236 remain off. In turn, the row driver 226 pulls the second LOFIC node 245 and the second end of the LOFIC 240 down toward a ground voltage (e.g., a negative power supply rail or another reference voltage). In some embodiments, the row driver 226 sees a relatively small capacitance loading on the VCAP line coupling the row driver 226 to the second end of the LOFIC 240 that is due at least in part to the capacitance of the LOFIC 240 arranged in series with the parasitic capacitance (not shown) at the first LOFIC node 243. In contrast with the enable signal EN illustrated in the timing diagram 360 of FIG. 3 that is left asserted until an end of the PD readout operation, the enable signal EN illustrated in the timing diagram 470 of FIG. 4 is deasserted toward an end of the integration operation and is left unasserted for the duration of the PD readout operation and the duration of the LOFIC readout operations.

During the PD readout operation, the second reset signal RST2 illustrated in the timing diagram 470 of FIG. 4 is asserted toward a beginning PD readout operation (e.g., at a same time that the first reset signal RST1 is asserted or pulsed), as opposed to being left unasserted for the duration of the PD readout operation as is done in the timing diagram 360 of FIG. 3. Assertion of the second reset signal RST2 activates the second reset transistor 237 and pulls the second LOFIC node 245 and the second end of the LOFIC 240 up toward the supply voltage (e.g., without use of a global row pull-up driver). The second reset signal RST2 is then left asserted until an end of the LOFIC readout operation. Similar to the timing diagram 360 of FIG. 3, at no time in the timing diagram 470 of FIG. 4 is the second reset signal RST2 asserted while the enable signal EN is asserted. In other words, assertion of the second reset signal RST2 does not overlap with assertion of the enable signal EN such that there is not a time at which the second LOFIC node 245 and the second end of the LOFIC 240 are actively coupled to both (a) the row driver 226 via the switch 228 and (b) the supply voltage via the second reset transistor 237.

The dual floating diffusion signal DFD is left unasserted during the PD readout operation of FIG. 4 such that asserting the second reset signal RST2 is not expected to otherwise alter the operation of the pixel cell 204 during the PD readout operation. As such, during the PD readout operation, the row select signal RS (shown in FIG. 2 but not shown in FIG. 4) is asserted to activate the row select transistor 234, and the pixel cell 204 outputs an analog image charge data signal corresponding to the photosensor 214 onto the column bitline 212. In some embodiments, the analog image charge data signal corresponding to the photosensor 214 is read out onto the column bitline 212 using correlated double sampling (CDS). For example, the first reset signal RST1 is pulsed while the dual floating diffusion signal DFD and the transfer signal TX are unasserted. During the pulse of the first reset signal RST1, the first reset transistor 236 is activated, and the floating diffusion 230 is pulled up toward the supply voltage. After pulsing the first reset signal RST1, a reset value of the PD readout operation that is output from the pixel cell 204 onto the column bitline 212 via the row select transistor 234 is sampled and held by readout circuitry peripheral to the pixel cell 204, as indicated by "SHR1" in the analog-to-digital signal ADC illustrated in FIG. 4.

In turn, the transfer signal TX is pulsed while the first reset signal RST1 and the dual floating diffusion signal DFD are unasserted. During the pulse of the transfer signal TX, the transfer transistor 222 is activated, and image charge generated by the photosensor 214 during the integration operation is transferred to the floating diffusion 230. After the pulse of the transfer signal TX, an analog image charge data signal of the PD readout operation that is output from the pixel cell 204 onto the column bitline 212 via the row select transistor 234 is sampled and held by the readout circuitry peripheral to the pixel cell 204, as indicated by "SHS1" in the analog-to-digital signal ADC illustrated in FIG. 4. The analog image charge data signal of the PD readout operation can be based at least in part on an amount of image charge in the floating diffusion 230. The pixel cell 204 then proceeds to perform the LOFIC readout operation consistent with discussion of the LOFIC readout operation of FIG. 3 above.

C. CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those skilled in the relevant art will recognize. For example, although steps are presented in a given order above, alternative embodiments may perform steps in a different order. Furthermore, the various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where context permits, singular or plural terms may also include the plural or singular term, respectively. In addition, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B.

Additionally, the terms "comprising," "including," "having," and "with" are used throughout to mean including at least the recited feature(s) such that any greater number of the same features and/or additional types of other features are not precluded. Moreover, as used herein, the phrases "based on," "depends on," "as a result of," and "in response to" shall not be construed as a reference to a closed set of conditions. For example, an exemplary step that is described as "based on condition A" may be based on both condition A and condition B without departing from the scope of the present disclosure. In other words, as used herein, the phrase "based on" shall be construed in the same manner as the phrase "based at least in part on" or the phrase "based at least partially on."

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A pixel cell, comprising:
   a photosensor configured to photogenerate image charge in response to incident light;
   a floating diffusion (FD) to receive the image charge from the photosensor;
   a transfer (TX) transistor coupled between the FD and the photosensor to transfer the image charge to the FD;
   a first reset (RST1) transistor coupled between the FD and a voltage supply;
   a capacitor having two ends, a first end of the capacitor coupled to the FD; and
   a second reset (RST2) transistor coupled between a second end of the capacitor and the voltage supply.

2. The pixel cell of claim 1, further comprising a dual floating diffusion (DFD) transistor coupled between the first end of the capacitor and the FD.

3. The pixel cell of claim 2, wherein the RST1 transistor, the RST2 transistor, and the DFD transistor are arranged such that the two ends of the capacitor are shorted together when the RST1 transistor, the RST2 transistor, and the DFD transistor are in an activated state at a same time.

4. The pixel cell of claim 1, wherein the second end of the capacitor is further coupled to a row driver.

5. The pixel cell of claim 4, wherein the second end of the capacitor is selectively coupled to the row driver via an enable (EN) transistor, and wherein the EN transistor and the RST2 transistor are configured such that the EN transistor and the RST2 transistor are never simultaneously active.

6. The pixel cell of claim 4, wherein the second end of the capacitor is configured to be pulled down through the row driver.

7. The pixel cell of claim 6, wherein the second end of the capacitor is configured to be pulled up through the RST2 transistor.

8. The pixel cell of claim 1, wherein the RST2 transistor is further coupled to another capacitor of a different pixel cell.

9. The pixel cell of claim 1, further comprising:
a source follower (SF) transistor coupled to the voltage supply and having a gate coupled to the FD; and
a row select (RS) transistor coupled to the SF transistor and a bitline, wherein the SF transistor is coupled to output an analog image charge data signal to the bitline in response to the image charge in the FD.

10. The pixel cell of claim 1, wherein the capacitor is a lateral overflow integration capacitor (LOFIC).

11. The pixel cell of claim 10, wherein the LOFIC is a metal-insulator-metal (MIM) type having an insulator material between two metal ends.

12. The pixel cell of claim 11, wherein the insulator material is a high-κ type.

13. The pixel cell of claim 1, wherein the pixel cell is included in a row of a plurality of rows of pixel cells of a pixel array, and wherein the RST2 transistor is shared among a plurality of rows that are read simultaneously.

14. The pixel cell of claim 1, further comprising a transistor coupling the photosensor to the first end of the capacitor, wherein the transistor includes a gate tied to a reference voltage.

15. A pixel cell, comprising:
a photosensor configured to photogenerate image charge in response to incident light;
a floating diffusion (FD) to receive the image charge from the photosensor;
a capacitor having two ends, the capacitor configured to receive an overflow charge from the photosensor when the image charge generated by the photosensor exceeds a threshold amount; and
circuitry that receives one or more control signals and selectively forms, in response to the one or more control signals, an electrical loop that connects the two ends of the capacitor.

16. The pixel cell of claim 15, wherein the circuitry includes:
a first reset (RST1) transistor coupled between the FD and a voltage supply; and
a second reset (RST2) transistor coupled between a first end of the capacitor and the voltage supply.

17. The pixel cell of claim 16, wherein the RST2 transistor is further coupled to another capacitor of a different pixel cell.

18. The pixel cell of claim 16, wherein the pixel cell is included in a row of a plurality of rows of pixel cells of a pixel array, and wherein the RST2 transistor is shared among a predetermined number of rows of the plurality of rows that are read simultaneously.

19. The pixel cell of claim 16, wherein the circuitry further includes a dual floating diffusion (DFD) transistor coupled between the FD and a second end of the capacitor.

20. The pixel cell of claim 16, wherein the first end of the capacitor is configured to be pulled up through the RST2 transistor.

21. The pixel cell of claim 15, wherein the one or more control signals are generated by control circuitry coupled to the pixel cell, and wherein, in response to the one or more control signals, the circuitry forms the electrical loop during select moments during a precharge operation and/or a capacitor readout operation of the pixel cell.

22. The pixel cell of claim 21, wherein the pixel cell is selectively coupled to a row driver, and wherein the pixel cell is uncoupled from the row driver when the circuitry forms the electrical loop.

23. The pixel cell of claim 22, wherein an end of the two ends of the capacitor is configured to be pulled down through the row driver.

24. The pixel cell of claim 22, further comprising a source follower transistor having a gate coupled to the FD.

25. The pixel cell of claim 15, wherein the capacitor is coupled to a pull-down row driver but not to a pull-up row driver.

26. The pixel cell of claim 15, wherein the capacitor is a lateral overflow integration capacitor (LOFIC).

27. The pixel cell of claim 15, further comprising a transistor coupling an end of the two ends of the capacitor to the photosensor, wherein the transistor includes a gate tied to a reference voltage.

28. The pixel cell of claim 15, further comprising a transfer (TX) transistor coupled between the FD and the photosensor to transfer the image charge to the FD.

29. An imaging system, comprising:
a row of pixel cells, wherein each pixel cell of the row includes:
(a) a photosensor configured to photogenerate image charge in response to incident light;
(b) a capacitor having two ends, the capacitor configured to receive an overflow charge from the photosensor when the image charge generated from the photosensor exceeds a threshold amount; and
(c) a first reset (RST1) transistor and a second reset (RST2) transistor, wherein the RST1 transistor is coupled between a floating diffusion (FD) and a voltage supply, wherein the RST2 transistor is coupled between the capacitor and the voltage supply; and
control circuitry coupled to the row of pixel cells, wherein the control circuitry is configured to generate one or more control signals to selectively cause an electrical short between the two ends of the capacitor.

30. The imaging system of claim 29, wherein the control circuitry selectively causes the electrical short in response to turning on the RST1 transistor and the RST2 transistor.

31. The imaging system of claim 29, wherein each pixel cell of the row further includes a dual floating diffusion (DFD) transistor coupled between the FD and the capacitor, and wherein the control circuitry causes the electrical short in response to turning on the RST1 transistor, the RST2 transistor, and the DFD transistor.

32. The imaging system of claim 29, wherein the imaging system further comprises a row driver coupled to the row of pixel cells through an enable (EN) transistor, and wherein the control circuitry is further configured to control the RST2 transistor and the EN transistor such that the RST2 transistor is never on while the EN transistor is on.

33. The imaging system of claim 32, wherein the row driver is a pull-down driver.

34. The imaging system of claim 33, wherein a pull-up row driver is not coupled to the capacitors of each pixels cell of the row of pixel cells.

35. The imaging system of claim 29, wherein the control circuitry is configured to selectively cause the electrical short during a precharge phase and/or a capacitor readout phase.

36. The imaging system of claim 29, wherein each pixel cell of the row further includes a transfer transistor coupled between the FD and the photosensor.

37. The imaging system of claim 29, wherein each pixel cell of the row further includes a source follower transistor having a gate coupled to the FD.

\* \* \* \* \*